United States Patent
Dean et al.

(10) Patent No.: US 7,209,778 B2
(45) Date of Patent: Apr. 24, 2007

(54) EMBEDDED THERMAL CONTROL SYSTEM FOR HIGH FIELD MR SCANNERS

(75) Inventors: David Dean, Hartland, WI (US); Ariel Friedlander, Mequon, WI (US); David Ferguson, Sussex, WI (US)

(73) Assignee: General Electric Company, Schenectady, NY (US)

( * ) Notice: Subject to any disclaimer, the term of this patent is extended or adjusted under 35 U.S.C. 154(b) by 528 days.

(21) Appl. No.: 10/065,247

(22) Filed: Sep. 27, 2002

(65) Prior Publication Data
US 2004/0064031 A1    Apr. 1, 2004

(51) Int. Cl.
*A61B 5/05* (2006.01)
(52) U.S. Cl. ...................................................... 600/412
(58) Field of Classification Search ........ 600/410–424; 324/315, 318, 322
See application file for complete search history.

(56) References Cited

U.S. PATENT DOCUMENTS

| | | | |
|---|---|---|---|
| 5,652,517 A | | 7/1997 | Maki et al. |
| 5,916,161 A | * | 6/1999 | Ishihara et al. ............. 600/410 |
| 6,516,282 B2 | * | 2/2003 | Hedlund et al. ............ 702/132 |
| 6,777,939 B2 | * | 8/2004 | Bechtold et al. ............ 324/322 |
| 6,992,483 B1 | * | 1/2006 | Emeric et al. .............. 324/300 |
| 2002/0148604 A1 | * | 10/2002 | Emeric et al. .............. 165/206 |

* cited by examiner

*Primary Examiner*—Francis J. Jaworski
(74) *Attorney, Agent, or Firm*—Ziolkowski Patent Solutions Group, SC; Michael A. Della Penna; Carl B. Horton

(57) ABSTRACT

A thermal control system having an initial bore condition and a thermal boundary condition for an MRI includes a thermal controller adapted to set at least one dynamic limit on power input into an MRI gradient coil. The dynamic limit is determined for a first commanded prescription as a function of the initial bore condition and the thermal boundary condition.

17 Claims, 3 Drawing Sheets

EMBEDDED THERMAL CONTROL SYSTEM FOR HIGH FIELD MR SCANNERS

BACKGROUND OF INVENTION

The present invention relates generally to Magnetic Resonance Imaging (MRI) systems, and more particularly, to an embedded thermal control system for high field MR scanners.

Magnetic Resonance Imaging (MRI) is a well-known procedure for obtaining detailed, two and three-dimensional images of patients based on nuclear magnetic resonance (NMR) principles. MRI is well suited for the imaging of soft tissues and is primarily used for diagnosing internal injuries.

Typical MRI systems include a magnet capable of producing an intense, homogenous magnetic field around a patient or portion of the patient; a radio frequency (RF) transmitter and receiver system, including a receiver coil also surrounds a portion of the patient; a magnetic gradient system localizes a portion of the patient; and a computer processing/imaging system, which receives the signals from the receiver coil and processes the signals into interpretable data, such as visual images.

The superconducting magnet is used in conjunction with a magnetic gradient coil assembly, which is sequentially pulsed to create a sequence of controlled gradients in the main magnetic field during a MRI data gathering sequence. The superconducting magnet and the magnetic gradient coil assembly include the radio frequency (RF) coil on an inner circumferential side of the magnetic gradient coil assembly. The controlled sequential gradients are effectuated throughout a patient imaging volume (patient bore) which is coupled to at least one MRI (RF) coil or antennae. The RF coils and a RF shield are typically located between the magnetic gradient coil assembly and the patient bore.

As a part of a typical MRI, RF signals of suitable frequencies are transmitted into the patient bore. Nuclear magnetic resonance (NMR) responsive RF signals are received from the patient via the RF coils. Information encoded within the frequency and phase parameters of the received RF signals, by the use of a RF circuit, is processed to form visual images. These visual images represent the distribution of NMR nuclei within a cross-section or volume of the patient within the patient bore.

In modem MRI, active electric coils are used to drive spatial gradients into the static magnetic field. Enhanced imaging sequences typically demand high amplitude gradient fields, rapid field transitions, and large duty cycles in order to improve resolution and scan time. Unfortunately, these properties also drive the power dissipation higher and thus cause higher temperatures in the scanner. For many desired use profiles, the resulting scanner temperatures would exceed the allowable limits and would thus force a halt in operation while the scanner cooled down. Historically, this halting has been avoided by setting a constant limit on a basic quantity, e.g. coil current. While this limits the peak power in a coil, it is independent of temporal response and therefore employs assumptions concerning the use profile and boundary conditions. Those assumptions are generally conservative so as to limit any risk of patient exposure to excessive temperatures. Thus, the historic scheme for limiting power into gradient coils often places unnecessary limits on the gradient fields available to the prescriptions because the actual use timelines and boundary conditions are ignored.

It would therefore be desirable to include an enhanced imaging sequence in an MRI without placing unnecessary limits on gradient fields. It would also be desirable to limit peak power in a coil in response to actual use timelines. The present invention is directed to these ends.

SUMMARY OF INVENTION

One aspect of the present invention provides a thermal control system having an initial bore condition and a thermal boundary condition for an MRI. The system includes a thermal controller adapted to set at least one dynamic limit on power input into at least one gradient coil of the MRI. The at least one dynamic limit being a function of the initial bore condition and the thermal boundary condition.

Another aspect of the present invention provides a method for controlling thermal behavior in an MRI system. The method includes inputting at least one gradient field command into an embedded thermal controller. The at least one gradient field command is converted into a power level signal, and a model of the power level signal is generated therefrom. A model change in a gradient temperature is then generated from the model of the power level signal. An initial bore condition signal is generated from a temperature sensor coupled to the MRI. A gradient temperature signal is generated from a sum of the initial condition signal and the model change in the gradient temperature. A change in bore temperature signal is generated through summing the model of the power level signal and a model of the current bore temperature generated from the gradient temperature signal summed with the bore temperature signal. A second boundary condition is summed with the change in bore temperature to generate the current bore temperature and a gradient field is responsively adjusted.

One of several advantages of the present invention is that the temporally predictive scheme generally allows higher power levels than simple fixed gradient limit schemes.

Another advantage of the present invention is that when energetic scanner use causes high temperatures, the present invention adjusts input power to avoid an over-limit condition and a halt resulting therefrom.

The present invention itself, together with attendant advantages, will be best understood by reference to the following detailed description, taken in conjunction with the accompanying figures.

BRIEF DESCRIPTION OF DRAWINGS

For a more complete understanding of this invention reference should now be had to the embodiments illustrated in greater detail in the accompanying figures and described below by way of examples of the invention wherein.

DETAILED DESCRIPTION

Figure 1:
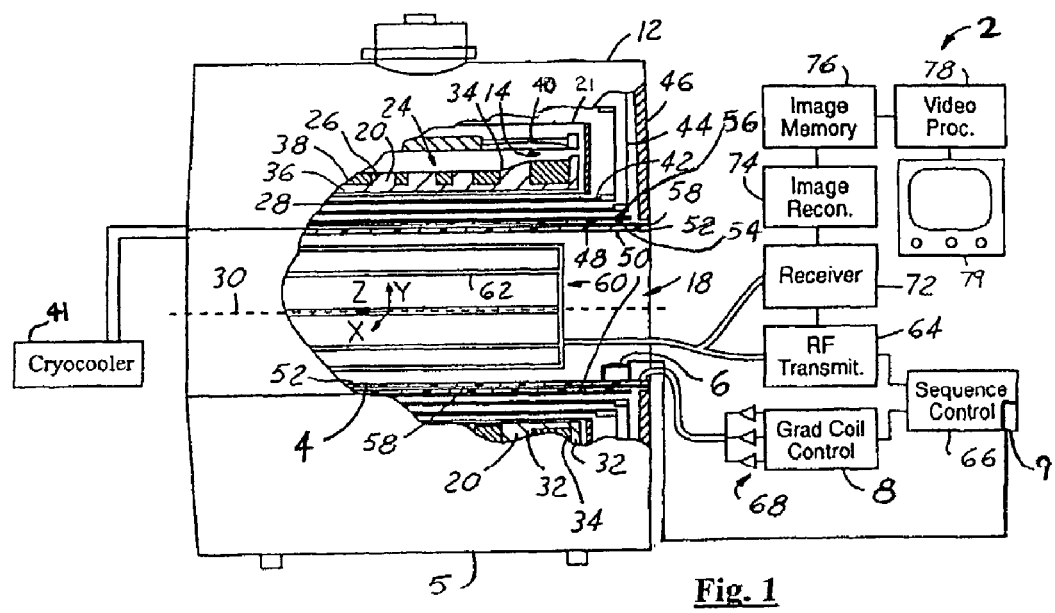
FIG. 1 is a block diagrammatic view of a MRI thermal control system in accordance with an embodiment of the present invention.

In each of the following figures, the same reference numerals are used to refer to the same components. While the present invention is described with respect to a thermal control method and apparatus for high field MR scanners, the present invention may be adapted to set dynamic limits on power received in gradient coils within various systems including: MRI systems, magnetic resonance spectroscopy systems, and other applications where thermal conditions interfere with system functions.

In the following description, various operating parameters and components are described for one constructed embodiment. These specific parameters and components are included as examples and are not meant to be limiting.

Also in the following description, a MRI system component may include any one of the following: a superconducting magnet, a superconducting magnet support structure, a gradient magnet assembly, a cryostat, a cryocooler, a cryostat support structure, or any other MRI system component known in the art.

Referring now to FIG. 1, a block diagrammatic view of a MRI thermal control system 2 is shown. The system 2 includes a gradient coil 4, at least one temperature sensor 6, a gradient coil control actuator 8, and an embedded thermal controller 9 all of which are coupled to the MRI 5.

The MRI system 2 further includes a static magnet structure 12 including a superconducting magnet 14 having a plurality of superconducting magnetic field coils which generate a temporally constant magnetic field along a longitudinal z-axis of a patient bore 18. The superconducting magnet coils are supported by a superconducting magnet coil support structure 20 and received in a cryostat 12.

The temperature sensor 6, coupled to the static magnet structure 12, receives temperature data from the patient bore 18. In other words, the sensor 6 senses an initial condition of the patient bore 18 and therefrom generates an initial condition signal and also senses a thermal boundary, which is a limit over which the embedded thermal controller 9 will reduce or shut off power to the gradient coil 4, and therefrom generates a thermal boundary signal. Alternate embodiments include a plurality of temperature sensors arranged around the patient bore 18 and coupled to the static magnet structure 12. For example, a first temperature sensor adapted to sense the initial condition and therefrom generate the initial condition signal and a second temperature sensor adapted to sense the thermal boundary and therefrom generate the thermal boundary signal.

The superconducting magnet coil support structure 20 provides support for static loads and allows fabrication and accurate placement of coils. Only one superconducting magnet 14 and one superconducting magnet coil support structure 20 are shown, however, the disclosed system may have multiple superconducting magnets and superconducting magnet coil support structures.

The superconducting magnet coil support structure 20 is preferably a solid body and includes an exterior side 24, an exterior portion 26, and an interior side 28. The exterior side 24 is the longitudinal side farthest away from the center 30 of the patient bore 18 that supports the superconducting magnet 14. The exterior side 24 has a plurality of shoulders 32 and a plurality of pockets 34. The plurality of shoulders 32 and the plurality of pockets 34 have dimensions corresponding to dimensions of the superconducting magnet 14. The interior portion 26 is the solid body of the superconducting magnet coil support structure 20. The interior portion 26 has a base 36. The plurality of shoulders 32 are integrally connected to the external side 38 of the base 36. The interior side 28 is preferably cylindrical shaped and is the side closest to the center 30 of the patient bore 18.

Cryostat 12 includes toroidal helium vessel 21 and main magnetic field shield coil assembly 40. The cryostat 12 is coupled to a cryocooler 41. The cryocooler 41 maintains the helium vessel 21 at proper operating temperatures.

The main magnetic field shield coil assembly 40 generates a magnetic field that opposes the field generated by the main magnet coils 14. A first coil shield 42 surrounds the helium vessel 39 to reduce "boil-off." A second coil shield 44 surrounds the first coil shield 42. Both the first coil shield 42 and the second coil shield 44 are preferably cooled by mechanical refrigeration. The first coil shield 42 and the second coil shield 44 encase a toroidal vacuum vessel 46. The toroidal vacuum vessel 46 includes a cylindrical member 48 that defines the patient bore 18 and extends parallel to a longitudinal axis. On a first exterior side 50 of the cylindrical member 48, which is longitudinal side farthest away from the center 30, of the patient bore 18 is a magnetic gradient coil assembly 52 containing the gradient coil 4. Located on a second exterior side 54 of the magnetic gradient coil assembly 52 is a cylindrical dielectric former 56. A RF shield 58 is applied to the cylindrical dielectric former 56.

The patient bore 18 has a RF coil assembly 60 (antennae) mounted therein. The RF coil assembly 60 includes a primary RF coil 62 and the RF shield 58.

A RF transmitter 64 is connected to a sequence controller 66 and the primary RF coil 62. The RF transmitter 64 is preferably digital. The sequence controller 66 controls a series of current pulse generators 68 via the gradient coil control actuator 8 that is connected to the magnetic gradient coil assembly 52. The gradient coil control actuator 8 adjusts a gradient field of the gradient coil 4. The sequence controller includes the embedded thermal controller 9.

The embedded thermal controller 9 includes a control loop, which sets dynamic limits on the power injected into the gradient coils. The limits are determined for each commanded prescription as a function of the initial thermal boundary conditions. This is accomplished through a thermal predictor software module, which includes a computational algorithm to model a series of coupled first order dynamic subsystems designed to simulate the actual thermal characteristics of the MRI 5. In other words, the invention uses knowledge of thermal boundary and initial conditions in conjunction with a prediction algorithm to dynamically set limits on the electrical power allowed into the gradient coils 4. This temporally predictive scheme generally allows higher power levels than those employing a simple fixed limit on gradient current. Additionally, when energetic scanner use causes high temperatures, the present invention adjusts the input power to avoid an over-limit condition and resulting halt to scanning.

The embedded thermal controller 9 receives the initial condition signal and the thermal boundary signal, sets at least one dynamic limit on power input into the gradient coil 4 in response to the initial condition signal and the thermal boundary signal. The embedded thermal controller 9 also activates the gradient coil control actuator 8 in response to the dynamic limit.

The RF transmitter 64 in conjunction with the sequence controller 66 generates pulses of radio frequency signals for exciting and manipulating magnetic resonance in selected dipoles of a portion of the subject within the patient bore 18.

A radio frequency receiver 72 is connected with the primary RF coil 62 for demodulating magnetic resonance signals emanating from an examined portion.

Figure 2:
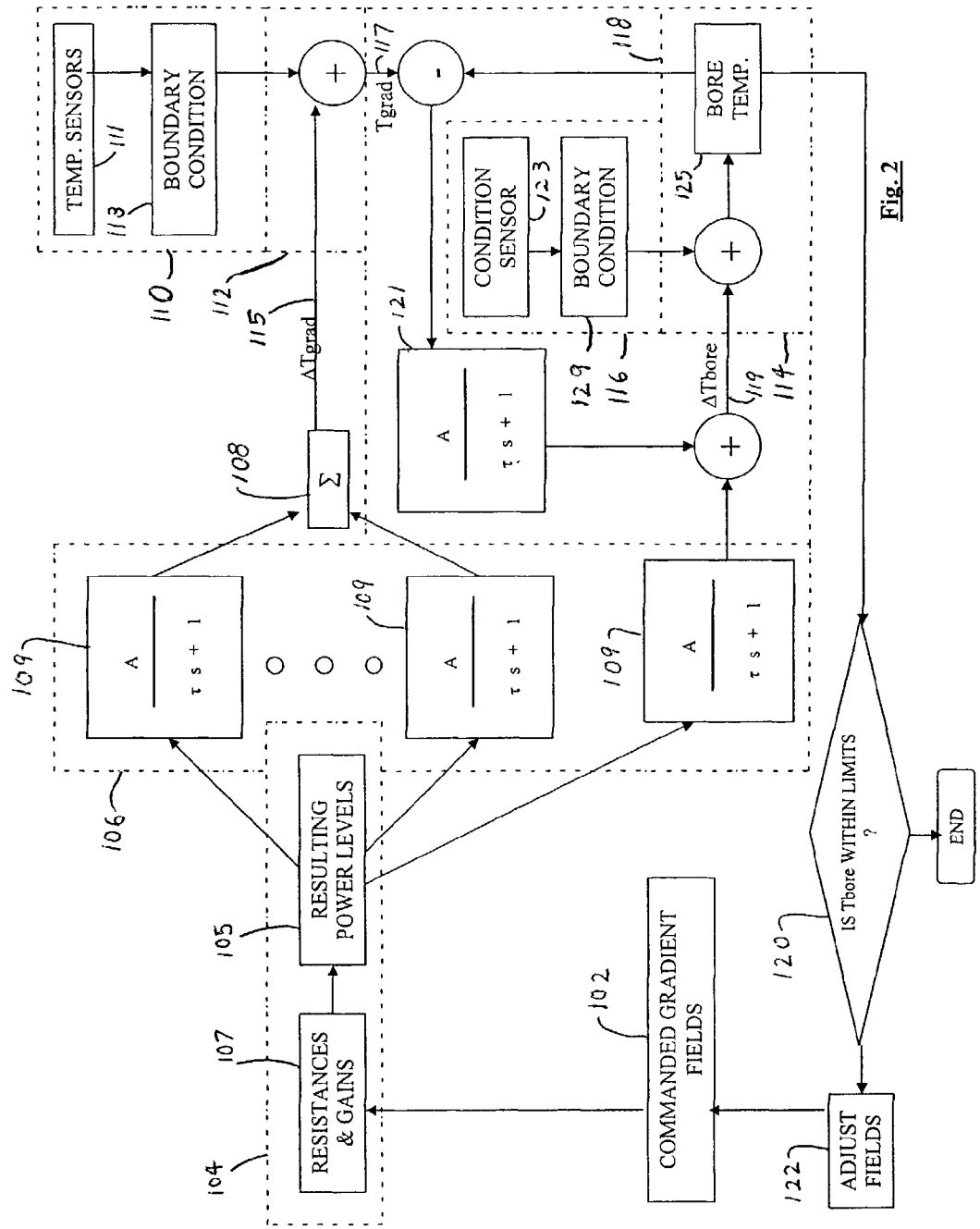
FIG. 2 is a block diagrammatic view illustrating a method for controlling thermal behavior in an MRI system in accordance with an embodiment of the present invention.
Figure 3:
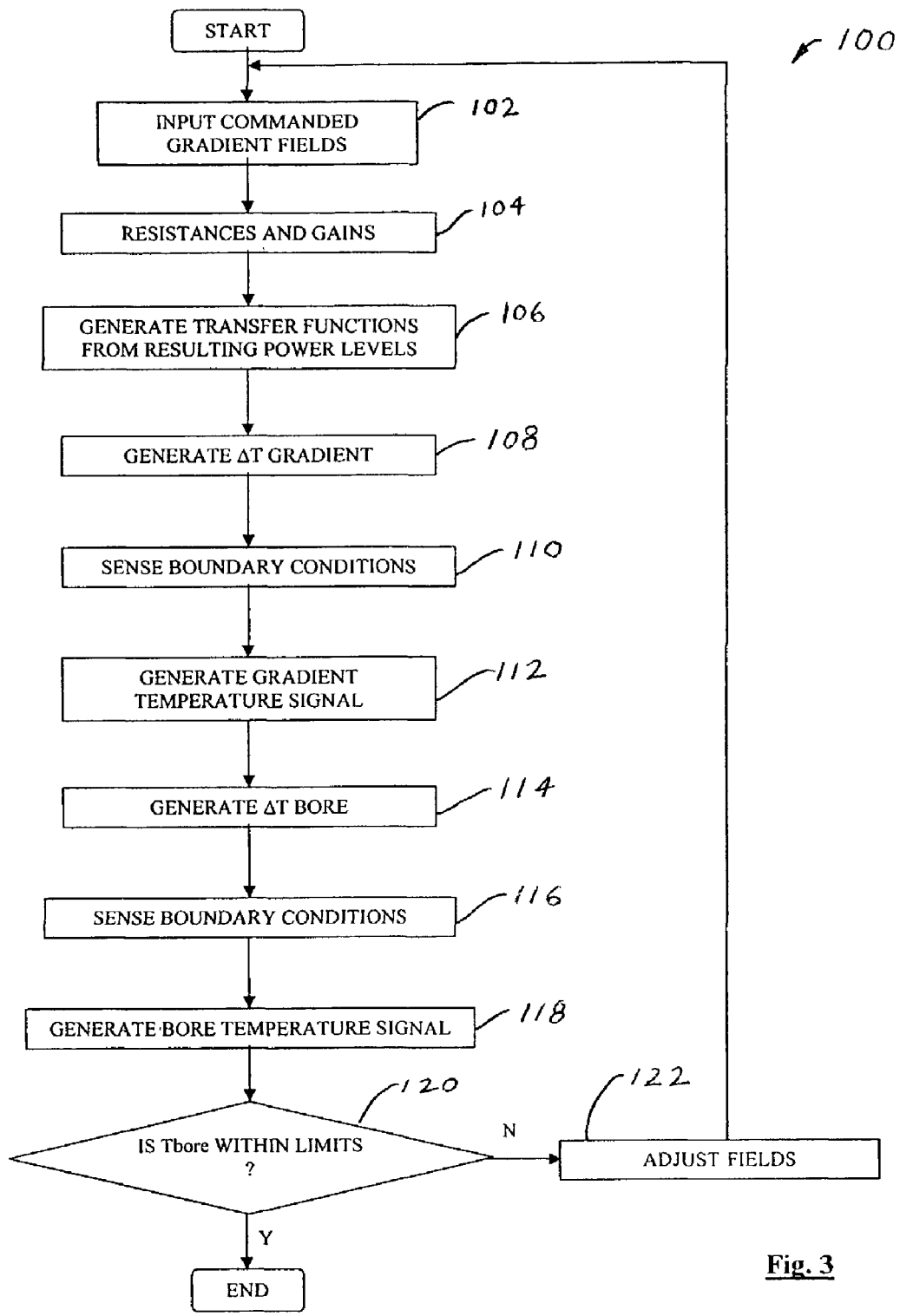
FIG. 3 is a logic flow diagram of FIG. 2.

Referring now to FIG. 2 and FIG. 3, a logic flow diagram illustrating a method 100 of controlling thermal behavior in an MRI system, in accordance with an embodiment of the present invention, is shown.

Logic starts in operation block 102, when commanded gradient fields are input. In other words, the superconducting magnet is used in conjunction with a magnetic gradient coil assembly, which is sequentially pulsed to create a sequence of controlled gradients in the main magnetic field during a MRI data gathering sequence, thereby inputting gradient fields into the embedded thermal controller.

In operation block 104, the gradient field signal converts into a resulting power signal 105 in response to internal resistances and gains 107 of the gradient coil 4.

In operation block 106, transfer functions are generated (e.g. $A/(\tau s+1)$ 109) as a model of the resulting power level signals from operation block 104.

In operation block 108, the control method 100 the transfer functions are summed together to generate the change in the gradient coil temperature or a $\Delta$ Tgrad 115.

In operation block 110, temperature sensors 111 coupled to the MRI generate boundary condition signals 113.

In operation block 112, the gradient coil temperature signal 117 is generated from the sum of the boundary condition signals 111 and the $\Delta$ Tgrad signal 115.

In operation block 114, the change in bore temperature or $\Delta$ Tbore 119 is generated through a control loop. More specifically, a resulting power level transfer function signal 109 and a transfer function signal 121, generated from the current bore temperature 125 subtracted from the gradient temperature 117, are summed to generate $\Delta$ Tbore 119.

In operation block 116, at least one boundary condition 129 is sensed through a second sensor 123 or plurality of sensors. This boundary condition is summed with the $\Delta$ Tbore 119 to generate the current bore temperature signal 125, which is alternately generated from a temperature sensor within the bore, in operation block 118.

In inquiry block 120, a check is made as to whether the current bore temperature is within predetermined limits. For a negative response, operation block 122 activates, and the fields are adjusted, either by a responsive computer control unit or through manual adjustment, and logic flow returns to operation block 102. Otherwise, the MRI system remains at the current temperature or temperature flux.

The above-described operation blocks are meant to be an illustrative example, the operation blocks may be performed synchronously or in a different order depending upon the application.

In operation the method includes inputting at least one gradient field command into an embedded thermal controller. The gradient field command is converted into a power level signal, and a model of the power level signal is generated therefrom. A model change in a gradient temperature is then generated from the model of the power level signal. An initial bore condition signal is generated from a temperature sensor coupled to the MRI. A gradient temperature signal is generated from a sum of the initial condition signal and the model change in the gradient temperature. A change in bore temperature signal is generated through summing the model of the power level signal and a model of the current bore temperature generated from the gradient temperature signal summed with the bore temperature signal. A second boundary condition is summed with the change in bore temperature to generate the current bore temperature and a gradient field is responsively adjusted.

The above-described system and method, to one skilled in the art, is capable of being adapted for various purposes and is not limited to the following systems: MRI systems, magnetic resonance spectroscopy systems, and other applications where high bore temperature is an issue in the design of system components. The above-described invention may also be varied without deviating from the spirit and scope of the invention as contemplated by the following claims.

What is claimed is:

1. A thermal control system having an initial bore condition and a thermal boundary condition for an MRI comprising:
a thermal controller adapted to set at least one dynamic limit on a power input into at least one gradient coil of the MRI while maintaining at least some power to said at least one gradient coil said at least one dynamic limit being a function of the initial bore condition and the thermal boundary condition.

2. The system of claim 1 wherein at least one temperature sensor is adapted to sense the initial bore condition and therefrom generate an initial condition signal and said at least one temperature sensor further adapted to sense the thermal boundary condition and therefrom generate a thermal boundary signal.

3. The system of claim 2 wherein said at least one temperature sensor comprises a first temperature sensor adapted to sense the initial condition and therefrom generate said initial condition signal and a second temperature sensor adapted to sense the thermal boundary and therefrom generate said thermal boundary signal.

4. The system of claim 1 wherein said thermal controller sets said at least one dynamic limit by receiving at least one gradient field;
converting said at least one gradient field command into a power level signal;
generating a model of said power level signal;
generating a model change in a gradient temperature from said model of said power level signal;
generating an initial bore condition signal from a temperature sensor coupled to the MRI;
generating a gradient temperature signal from a sum of said initial bore condition signal and said model change in said gradient temperature;
generating a change in bore temperature signal through summing said model of said power level signal and a model of said current bore temperature generated from said gradient temperature signal summed with said bore temperature signal;
summing a second boundary condition with said change in bore temperature to generate said current bore temperature; and
adjusting a gradient field.

5. The system of claim 1 wherein said thermal controller is adapted to set said at least one dynamic limit through a thermal predictor software module, which includes a computational algorithm for modeling a series of coupled first order dynamic subsystems designed to simulate at least one actual thermal characteristic of the MRI.

6. The system of claim 1 further comprising a gradient coil control actuator adapted to adjust a gradient field of said at least one gradient coil in response to an activation signal from said thermal controller generated in response to said dynamic limit.

7. A method for controlling thermal behavior in an MRI system comprising:
inputting at least one gradient field command into an embedded thermal controller;
converting said at least one gradient field command into a power level signal;
generating a model of said power level signal;
generating a model change in a gradient temperature from said model of said power level signal;
generating an initial bore condition signal from a temperature sensor coupled to the MRI;

generating a gradient temperature signal from a sum of said initial condition signal and said model change in said gradient temperature;

generating a change in bore temperature signal through summing said model of said power level signal and a model of said current bore temperature generated from said gradient temperature signal summed with said bore temperature signal;

summing a second boundary condition with said change in bore temperature to generate said current bore temperature; and adjusting a gradient field.

8. The method of claim 7 wherein inputting at least one gradient field command into an embedded thermal controller further comprises inputting gradient fields resultant from a superconducting magnet used in conjunction with a magnetic gradient coil assembly, which is sequentially pulsed to create a sequence of controlled gradients in a main magnetic field during a MRI data gathering sequence.

9. The method of claim 7 wherein converting said at least one gradient field command into a power level signal further comprises converting said at least one gradient field command into a plurality of power level signals in response to internal resistances and gains.

10. The method of claim 7 wherein generating a model of said power level signal comprises generating a plurality of transfer functions as a model of said power level signals.

11. The method of claim 7 wherein generating a model change in a gradient temperature from said model of said power level signal further comprises summing said plurality of transfer functions to generate said change in said gradient temperature signal.

12. A method as in claim 7 wherein adjusting a gradient field comprises adjusting a gradient field by at least one of a responsive computer control unit or a manual adjustment.

13. An MRI thermal control system comprising:
a gradient coil coupled to the MRI;
at least one temperature sensor adapted to sense an initial bore condition and therefrom generate an initial bore condition signal and said at least one temperature sensor further adapted to sense a thermal boundary and therefrom generate a thermal boundary signal;
gradient coil control actuator adapted to adjust a gradient field of said gradient coil; and
an embedded thermal controller adapted to receive said initial condition signal and said thermal boundary signal, said embedded thermal controller further adapted to set at least one dynamic limit on power input into said gradient coil in response to said initial condition signal and said thermal boundary signal, said embedded thermal controller further adapted to activate said gradient coil control actuator in response to said dynamic limit.

14. The system of claim 13 wherein said at least one temperature sensor comprises a first temperature sensor adapted to sense said initial condition and therefrom generate said initial condition signal and a second temperature sensor adapted to sense said thermal boundary and therefrom generate said thermal boundary signal.

15. The system of claim 13 wherein said gradient coil control actuator is adapted to adjust an input power to avoid an over-limit condition within said gradient coil when energetic scanner use causes high temperatures.

16. The system of claim 13 wherein said embedded thermal controller is adapted to set at least one dynamic limit through inputting at least one gradient field command into said embedded thermal controller;

converting said at least one gradient field command into a power level signal;

generating a model of said power level signal;

generating a model change in a gradient temperature from said model of said power level signal;

generating an initial bore condition signal from a temperature sensor coupled to the MRI;

generating a gradient temperature signal from a sum of said initial condition signal and said model change in said gradient temperature;

generating a change in bore temperature signal through summing said model of said power level signal and a model of said current bore temperature generated from said gradient temperature signal summed with said bore temperature signal;

summing a second boundary condition with said change in bore temperature to generate said current bore temperature; and adjusting a gradient field.

17. The system of claim 13 wherein said embedded thermal controller is adapted to set at least one dynamic limit through a thermal predictor software module, which includes a computational algorithm for modeling a series of coupled first order dynamic subsystems designed to simulate at least one actual thermal characteristic of the MRI.

* * * * *

UNITED STATES PATENT AND TRADEMARK OFFICE
CERTIFICATE OF CORRECTION

PATENT NO. : 7,209,778 B2
APPLICATION NO. : 10/065247
DATED : April 24, 2007
INVENTOR(S) : Dean et al.

It is certified that error appears in the above-identified patent and that said Letters Patent is hereby corrected as shown below:

Col. 6, line 13 (Claim 8), delete "coil said" and substitute therefore -- coil, said --.

Signed and Sealed this

Tenth Day of July, 2007

JON W. DUDAS
*Director of the United States Patent and Trademark Office*